United States Patent [19]

Fujii et al.

[11] Patent Number: 5,016,089

[45] Date of Patent: May 14, 1991

[54] SUBSTRATE FOR HYBRID IC, HYBRID IC USING THE SUBSTRATE AND ITS APPLICATIONS

[75] Inventors: Mituru Fujii, Hadano; Tadamichi Asai, Ibaraki; Toshio Ogawa, Katsuta; Osamu Ito; Akira Ikegami, both of Hitachi; Mitsuru Hasegawa; Takao Kobayashi, both of Hitachi; Teizo Tamura, Katsuta, all of Japan

[73] Assignee: Hitachi, Ltd., Tokyo, Japan

[21] Appl. No.: 293,443

[22] Filed: Jan. 4, 1989

[30] Foreign Application Priority Data

Jan. 11, 1988 [JP] Japan ................................. 63-2591

[51] Int. Cl.⁵ ................... H01L 39/02; H01L 27/02; H01L 23/48; H01L 29/40
[52] U.S. Cl. ............................... 357/80; 357/51; 357/65; 357/67; 357/71
[58] Field of Search ................ 357/51, 80, 65, 67, 357/71

[56] References Cited

U.S. PATENT DOCUMENTS

| 4,057,777 | 11/1977 | Merz et al. | 338/309 |
| 4,139,832 | 2/1979 | Yoshino et al. | 338/308 |
| 4,424,251 | 1/1984 | Sugishita et al. | 428/209 |
| 4,517,584 | 5/1985 | Matsushita et al. | 357/80 |
| 4,645,948 | 2/1987 | Morris et al. | 307/296 R |
| 4,652,397 | 3/1987 | Nair | 252/513 |
| 4,685,203 | 8/1987 | Takada | 29/620 |
| 4,695,504 | 9/1987 | Watanabe et al. | 428/209 |

OTHER PUBLICATIONS

Patent Abstracts of Japan, vol. 7, No. 166, (59-73146—English Abstract).
Patent Abstracts of Japan, vol. 12, No. 49, (62-198145—English Abstract).

Primary Examiner—Rolf Hille
Assistant Examiner—David Ostrowski
Attorney, Agent, or Firm—Antonelli, Terry, Stout & Kraus

[57] ABSTRACT

A substrate for hybrid IC which comprises a substrate, a thick film resistor containing glass, formed on the substrate, and a thick film conductor at the terminal of the thick film resistor, where a means for preventing diffusion of the glass from the thick film resistor into the thick film conductor is provided between the thick film resistor and the thick film conductor has a stable resistance as a thick film microresistor and is applied to various uses such as cellular radio communication system.

18 Claims, 6 Drawing Sheets

LENGTH OF RESISTOR (μm)

INPUT

SUBSTRATE FOR HYBRID IC, HYBRID IC USING THE SUBSTRATE AND ITS APPLICATIONScl

BACKGROUND OF THE INVENTION

This invention relates to a substrate for ultra-small type thick film hybrid IC with a thick film microresistor and a process for preparing the same, a power source module for mobile radio communication using the same and a cellular radio communication system.

Heretofore, a hybrid IC has been prepared according to either thin film process or thick film process. According to the thin film process, a film is prepared by sputtering, etc. and conductor lines can be made much finer, for example, as fine as a resolution of 20 $\mu$m, through a photolithography. However, even if the conductor lines can be much made finer, a resistor to be used together cannot be made much finer, because the resistivity of the resistor material to be usually used in the thin film process is very low.

Usually, a sheet resistance of 10 $\Omega/\square$ to 1 M$\Omega/\square$ is required for the hybrid IC. In order to make a resistor with a high sheet resistance such as about 100 k$\Omega/58$ to about 1 M$\Omega/\square$ from a typical thin film resistor material such as TaN, etc., a larger area is required. For example, when calculation is made on the basis that the resistivity of TaN resistor material is 250$\mu\Omega$-cm, the film thickness of the resistor is 1 $\mu$m, and the line width of the resistor is 20 $\mu$m, the length of the resistor will be 80 cm at 100 k$\Omega/\square$ and 800 cm at 1 M$\Omega/\square$. When a resistor is designed at a resistor line width of 20 $\mu$m, the resistor dimension will be 5 mm$\times$5 mm at 100 k$\Omega/\square$ and 16 mm$\times$16 mm at 1 M$\Omega/\square$. Thus, even if the conductor lines can be made much finer according to the thin film process, the resistor cannot be made finer and it is difficult to make a ultra-small type, hybrid IC.

According to the thick film process, a film is formed usually by printing, as disclosed in Denshi Gijutsu, Vol. 25, No. 14 (1983), pages 10–11, 42–43, 78–79 and Japanese Patent Applications Kokai (Laid-Open) Nos. 53-133,501, 58-108,792, 52-137,667, 52-137,667, 53-65,970 and 59-201,482. However, there is a limit to making the conductor lines and the resistor much finer owing to the printing used for the preparation of a film. The limit thereto by the printing is now about 300 $\mu$m. However, the reliability of the thick film resistor material is very high and the thick film process has been so far actually applied. Furthermore, the resistivity of the thick film resistor material is very high and a resistivity of 1,500 $\Omega$-cm is possible (sheet resistance of 1 M$\Omega/\square$ at a film thickness of 15 $\mu$m). Thus, it seems that the thick film process is particularly suitable for making the resistor much smaller. However, as a result of various tests on combinations of copper conductor lines with thick film microresistors it has been found that it is difficult to control the resistance only by simple combinations of copper conductor lines with thick film microresistors.

That is, a resistor with a stable resistance can be obtained by forming copper conductor lines and thick film resistors according to a conventional thick film process only when the thick film resistors are long enough, but it has been found that, when the length of the thick film resistors is made smaller and smaller, the resistance will be much fluctuated and a stable resistance will be no more obtained. In this connection, the present inventors measured resistance of thick film microresistors to be combined with highly fine copper conductor lines by changing the length of the resistors to 100 $\mu$m, 200 $\mu$m, 300 $\mu$m, 400 $\mu$m, 500 $\mu$m, 700 $\mu$m or 1,000 $\mu$m while keeping the width of the resistor constant at 300 $\mu$m. The results of measurements are shown in FIG. 1 in terms of a ratio of sheet resistances ($R_x$) of resistors having various lengths to the sheet resistance ($R_{4.0}$) of a resistor having a size of 4 mm$\times$4 mm, i.e. $R_x/R_{4.0}$. It is apparent therefrom that resistors having lengths of 500 $\mu$m or more have a resistance substantially equal to the nominal sheet resistance of thick film resistor paste, and resistors having lengths of less than 500 $\mu$m have only very lower sheet resistances. This phenomenon will be a very large obstacle to designing the resistance of a resistor.

In order to investigate causes for this phenomenon, the present inventors conducted a line analysis of the boundary surface between the highly fine copper conductor lines and the thick film microresistors by EPMA, and have found that the glass in the thick film microresistor and on the highly fine copper conductor line side is diffused into the highly fine copper conductor lines to make the resistivity of the resistor much lower, because the highly fine copper conductor lines and the thick film microresistor are both made from materials of electroconductive powders and glass.

It has been found from the foregoing results that it is difficult to obtain an ultra-small hybrid IC based on a combination of highly fine copper conductor lines with thick film microresistors unless the diffusion of glass from the thick film microresistors into the highly fine copper conductor lines is suppressed.

SUMMARY OF THE INVENTION

An object of the present invention is to provide a substrate for hybrid IC with a stable resistance as a thick film microresistor, a process for preparing the same, a hybrid IC using the substrate and various uses of the hybrid IC such as a cellular radio communication system, etc.

The present invention provide a substrate for hybrid IC, which comprises a substrate (a base), a thick film resistor containing glass, formed on the substrate (base), and a thick film conductor, particularly copper conductor, formed at the terminal of the thick film resistor, where a means for preventing diffusion of the glass from the thick film resistor into the thick film conductor is provided between the thick film resistor and the thick film conductor.

According to the present invention, a metallic layer having a higher melting point than the firing temperature of the thick film resistor is provided as the means for preventing the diffusion of the glass or elements from the resistor into the conductor.

The thick film conductor and the thick film resistor each contain crystalline glass and amorphous glass and highly stable thick films can be obtained by appropriately combining the crystalline glass with the amorphous glass.

The present invention also provides a process for preparing a substrate for hybrid IC, which comprises a step of applying a conductor paste, particularly a copper conductor paste to a substrate and firing the applied conductor paste, thereby forming a thick film conductor with a desired circuit pattern, a step of providing a means for preventing diffusion of glass from a thick film resistor containing the glass to be formed at least at the terminal of the thick film conductor and in connection to the thick film conductor into the thick film conductor, and a step of applying a thick film resistor paste to the terminal of the thick film conductor and firing the applied resistor paste, thereby forming the thick film resistor with a desired circuit pattern at the terminal of the thick film conductor.

The means for preventing diffusion of glass according to the present invention can be formed by adding to a thick film resistor paste a compound capable of dissociating a metal having a higher melting point than the firing temperature at the boundary surface in the step of firing the applied thick film resistor paste or by applying a paste of metallic powder having a higher melting point than the firing temperature of the thick film resistor at least to the terminal of the thick film conductor and firing the applied paste of metallic powder, thereby forming a metallic layer before the formation of the thick film resistor.

The present invention further provides a hybrid IC, which comprises a semiconductor device-mounted substrate, a glass-containing thick film resistor and a thick film conductor, particularly a copper conductor, formed at the terminal of the thick film resistor, both on the substrate, where a means for preventing diffusion of glass from the thick film resistor into the thick film conductor is provided between the resistor and the conductor.

It is preferrable that the entire surface of semiconductor device, thick film resistor and thick film conductor are covered with a resin or glass, and the substrate is made from sintered ceramics, and the substrate is mounted on and joined with a metallic base plate. The metallic base plate is preferably a base plate of copper, aluminum, etc. and is preferably provided with perforations or recesses at the edge parts so that the metallic base plate can be mechanically joined with other members.

The present invention still further provides a composition for forming a hybrid IC circuit, which comprises a combination of a copper conductor paste containing copper powder, glass based on lead-aluminum-borosilicate, particularly glass powder based on silicon oxide-boron oxide-aluminum oxide-lead oxide, a vehicle and an organic solvent, and a resistor paste containing intermetallic compound powder, glass powder based on silicon oxide-boron oxide-aluminum oxide-lead oxide having the same composition as that of the glass powder of the copper conductor paste, a vehicle and an organic solvent.

Still furthermore, the present invention provides a thick film resistor paste, which comprises intermetallic compound powder, glass powder based on silicon oxide-boron oxide-aluminum oxide-lead oxide having the same compositions as that of the glass powder of the copper conductor paste, powder of compound capable of dissociating a metal by firing in a nonoxidative atmosphere, a vehicle and an organic solvent. Dissociation of the metal takes place at the boundary surface to form a metallic layer at the boundary surface.

The thick film copper conductor paste and the thick film resistor paste can give a stable resistance by using glass powder of different combinations of crystalline glass powder with amorphous glass powder from each other.

Still furthermore, the present invention provides a substrate for hybrid IC, which comprises a substrate, a thick film resistor containing glass, formed on the substrate, and a thick film conductor, particularly a copper conductor, formed at the terminal of the thick film resistor, where the thick film conductor is in a plan-viewed shape structure wider than the width of the thick film resistor at the connection part with the thick film resistor, or the plan-viewed shape of the thick film conductor is made long and narrow and the thick film resistor is formed as perpendicular, in the plan-viewed shape, to the longer side of the conductor. By making the plan-viewed structure of the thick film conductor wider than the width of the thick film resistor, a stable resistance can be obtained.

The foregoing substrates for hybrid IC according to the present invention can be used in a power source module for mobile radio communication, modules for the video camera brightness signal circuit, camera using the modules or modules for other information-processing apparatuses, computers, magnetic devices, magnetic disc devices, personal computers, word processors, display devices, money dispenser terminals, printers, etc.

According to the present invention, the following effects can be obtained.

(1) When a pure metallic layer containing no glass is provided between the conductor lines and the thick film resistor as a reaction-preventing film, no reaction takes place therebetween because of no direct contact of glasses contained in the conductor lines and the thick film resistor, thereby preventing the diffusion of glass.

(2) When the binder glass contained in the conductor lines is crystalline glass and that contained in the thick film resistor is amorphous glass, the reaction with the glass in the resistor can be suppressed because the binder glass contained in the conductor lines to be fired again in a successive step is crystalline glass, thereby preventing the diffusion of glass.

(3) When the binder glass contained in the resistor is crystalline glass and that contained in the conductor lines is amorphous glass, the reaction with the glass in the conductor lines can be suppressed because the binder glass contained in the resistor to be fired again in a successive step is crystalline glass, thereby preventing the diffusion of glass.

(4) When the binder glass in the resistor contains 1 to 20% by weight of copper oxide, metallic copper is preferentially precipitated on the copper conductor layer side by virtue of the action of copper conductor layer as a nuclei-forming source in the step of firing the resistor. The precipitated metallic copper layer acts as a diffusion-preventing layer and can prevent the diffusion of glass. In that case, no satisfactory metallic copper layer is formed below 1% by weight of copper oxide in the glass and the effect on the reaction prevention is not remarkable, whereas above 20% by weight of copper oxide in the glass a larger amount of metallic oxide also precipitates deep in the resistor, and the resistance is lowered, the temperature coefficient of resistance is increased, and changes in the resistance are large in the reliability test. Thus, the content of copper oxide in the binder glass of the resistor is desirably in a range of 1 to 20% by weight.

The present thick film conductor contains preferably 80% by weight or more of metallic component and 20% by weight or less of an inorganic binder. Furthermore, a thick film conductor comprising 1 to 20% by weight of glass as the inorganic binder, the balance being the metallic component, is preferable. Particularly, preferable is a thick film conductor comprising 2 to 5% by weight of lead-aluminum-borosilicate glass, the balance being a metallic component of gold, silver or copper, where copper is preferable owing to a low cost and a high strength. The thick film conductor is formed by application and firing of a powder paste and the thickness is preferably 50 to 400 μm. An inorganic binder containing bismuth oxide and copper oxide can be used for the copper conductor. The composition for the copper conductor paste is as described above and preferably comprises 70% by weight or more of copper powder, 5 to 15% by weight of an inorganic binder, 5 to 20% by weight of a vehicle and 0.3 to 2% by weight of an organic solvent. It is also preferable that the copper powder has particle sizes of not more than 10 μm and the inorganic binder, particularly glass powder, has the same particle sizes as that of the copper powder.

The present thick film resistor preferably comprises 15 to 50% by weight of an electroconductive intermetallic compound, the balance being an inorganic binder. The inorganic binder is preferably glass and 20 to 40% by weight thereof is preferable. The inorganic binder is more preferably glass based on lead-aluminum-borosilicate and glass containing the same components as those of the conductor is particularly preferable. It is also preferable that the present thick film resistor has a thickness of 5 to 100 μm and a width of 100 to 1,000 μm. The thick film resistor is formed by application and firing of a powder paste. As the intermetallic compound, borides are used and includes $TiB_2$, $ZrB_2$, $H_2B_2$, etc. having particle sizes of preferably not more than 10 μm. The resistor powder paste also contains a vehicle and an organic solvent as used in the thick film conductor paste.

The vehicle for use in the present invention includes, for example, aliphatic alcohols and esters thereof, such as acetate and propionate; terpenes such as wood turpentine oil, terpineol, etc.; resins such as a solution of lower alcohol polymethacrylate; solvents such as a solution of ethylcellulose in wood turpentine oil and monobutyl ether of ethyleneglycol monoacetate. Preferable vehicles are based on ethylcellulose and 2,2,4-trimethylpentanediol-1,3-monoisobutyrate. The vehicle can contain a volatile liquid for promoting rapid drying after application of the paste to a substrate.

The organic solvent for use in the present invention includes a broad range of various inert liquids and nonacrylic polymers, such as ethylcellulose, are particularly preferable.

The substrate for use in the present invention includes sintered ceramics, and generally sintered alumina is used. In addition, sintered SiC, AlN, $Si_3N_4$ and mullite can be also used. Sintered mixtures of these non-oxides can be also used. A glaze layer can be provided on the substrate.

According to the present invention, thick film microresistors with a high sheet resistance such as 100 kΩ/□ to 1 M Ω/□ can be obtained. The resistance of the present thick film resistors is readily controllable with a high reliability. Thus, a hybrid IC with a ultrahigh density which has not been so far prepared according to the conventional hybrid IC manufacturing technique can be obtained and thus it is possible to make various apparatus smaller in the scales.

PREFERRED EMBODIMENT OF THE INVENTION

The present invention will be described in detail below, referring to Examples, where mixing ratio, etc. are by weight.

EXAMPLE 1

A glaze layer based on $SiO_2$-$B_2O_3$-$Al_2O_3$-BaO was applied to an alumina base plate having a thickness of 0.8 mm, and subjected to surface polishing to a surface roughness of not more than 1 μm, and the thus prepared base plate was used as a substrate.

Figure 1:
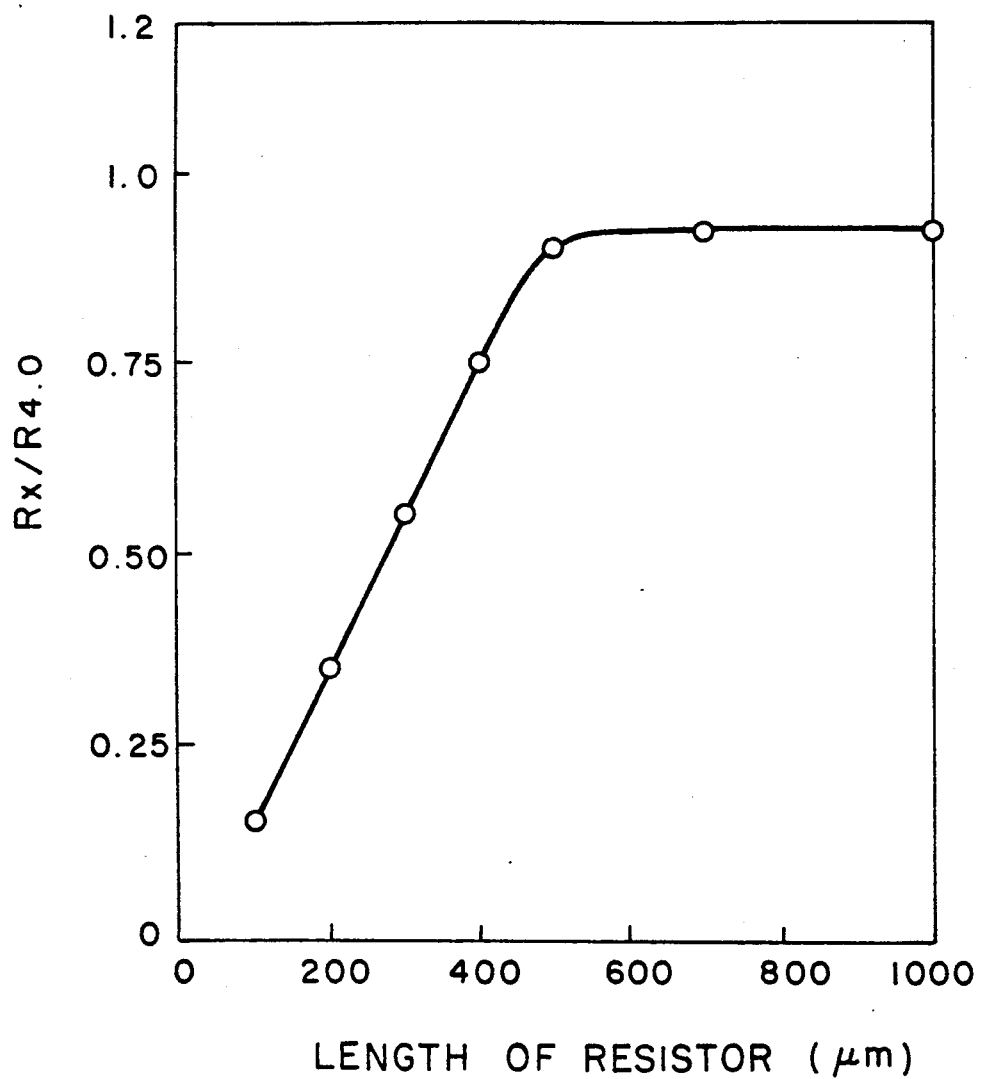
FIG. 1 is a diagram showing a relationship between a ratio of the sheet resistance ($R_x$) of a thick film microresistor formed according to a conventional process to the sheet resistance ($R_{4.0}$) of a resistor with a size of 4 mm×2 mm, i.e. $R_x/R_{4.0}$, and the length of the resistor.
Figure 2A:
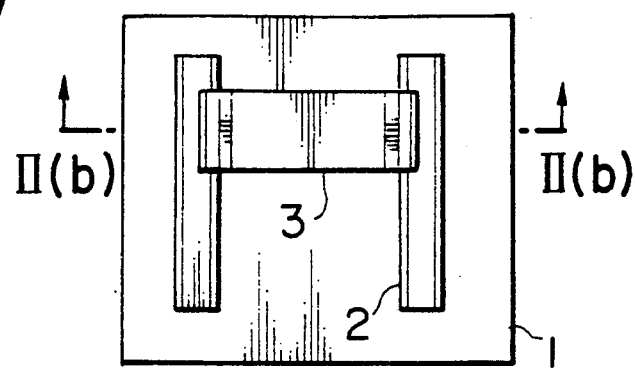
FIG. 2(a) is a plan view of a thick film circuit according to Example 1 and FIG. 2(b) is a vertical cross-sectional view along the line II(b)-II(b) of FIG. 2(a).
Figure 2B:
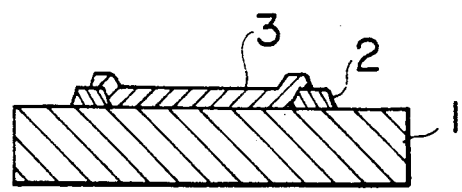

FIG. 2(a) is a plan view of thick film copper conductors 2 and a thick film resistor 3 formed on the alumina substrate 1, and FIG. 2(b) is a vertical cross-sectional view along the line II(b)-II(b) of FIG. 2(a), where the thick film copper conductors 2 were made wider than the width of the thick film resistor 3 and the edges of the thick film copper conductors 2 were outwardly extended over the thick film resistor 3.

100 parts of spherical copper powder having an average particle size of 0.7 μm, 5 parts of binder glass based on $SiO_2$-$B_2O_3$-$Al_2O_3$-PbO, 8 parts of acrylic resin as a vehicle and 24 parts of organic solvent butylcarbitol acetate were kneaded to prepare a copper paste. The thus prepared copper paste was applied to the alumina substrate 1 by screen printing, dried at 120° C. for 10 minutes and fired at 900° C. for 10 minutes in a continuous belt-type tunnel oven.

Then, two copper conductor electrodes with a line width of 40 μm and a predetermined length were formed at various distances by photolithography.

Separately, 100 parts of spherical copper powder having an average particle size of 0.7 μm, 7 parts of acrylic resin as a vehicle and 22 parts of organic solvent butylcarbitol acetate were kneaded to prepare a copper paste. The thus prepared copper paste was applied to the substrate with the foregoing printed copper conductors likewise by screen printing, dried at 120° C. for 10 minutes and fired at 900° C. for 10 minutes in a continuous belt-type, tunnel oven, whereby a copper conductor containing no binder glass was formed on the copper conductors containing the binder glass. Then, copper conductor electrodes with a line width of 4.5 μm and a thickness of 4 to 100 μm were likewise formed by photolithography.

The firing temperature of the thick film copper conductors was preferably 750° to 900° C.

Then, a resistor with a constant width of 300 μm and a length of 100 μm, 200 μm, 300 μm, 400 μm, 500 μm, 700 μm or 1,000 μm was prepared.

Figure 3:
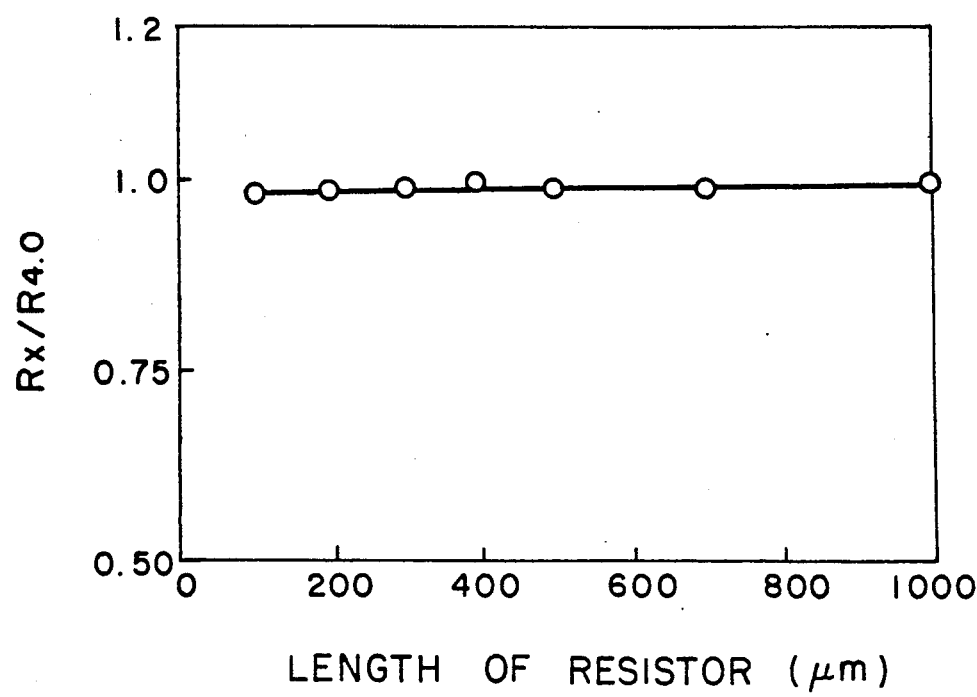
FIG. 3 is a diagram showing a relationship between $R_x/R_{4.0}$ of a resistor according to the present invention (Example 1) and the length of the resistor.

That is, 100 parts of $TiB_2$ powder having an average particle size of 0.8 μm, 200 parts of binder glass based on $SiO_2$-$B_2O_3$-$Al_2O_3$-PbO, 18 parts of acrylic resin as a vehicle and 55 parts of organic solvent butylcarbitol acetate were kneaded to prepare a resistor paste having a sheet resistance of 50 kΩ/□. The thus prepared resistor paste was applied to the substrate with the foregoing printed copper conductors likewise by screen printing and dried at 120° C. for 10 minutes. Then, a thick film, microresistor having a thickness of 5 to 100 μm was formed between the thick film copper conductors. Then, the applied resistor paste was fired at 900° C. for 10 minutes in a continuous belt type, tunnel oven. A relationship between the resistance and the length of the thus prepared thick film microresistors is shown in FIG. 3. Even the resistors having a length of less than 500 μm had a stable resistance with a good reproducibility due to the absence of the diffusion of glass.

It seems that the diffusion of glass between the thick film copper conductors 2 and the thick film resistor 3 is suppressed by the presence of the copper film.

EXAMPLE 2

Substrates for hybrid IC having the same plan viewed structure as that of FIG. 2(a) and the same vertical cross-sectional structure as that of FIG. 2(b) were prepared in the same manner as in Example 1.

100 parts of spherical copper powder having a an average particle size of 0.7 μm, 5 parts of crystalline binder glass based on $SiO_2$-$B_2O_3$-$Al_2O_3$-PbO-CaO, 7 parts of acrylic resin as a vehicle and 22 parts of organic solvent butylcarbitol acetate were kneaded to prepare a copper powder paste.

The thus prepared copper powder paste was applied to the same alumina substrate as used in Example 1, dried at 120° C. for 10 minutes and fired at 900° C. for 10 minutes in a continuous belt-type tunnel oven.

Then, two copper conductor electrodes with a line width of 40 μm were formed by photolithography.

Then, a resistor having a constant width of 300 μm and a length of 100 μm, 200 μm, 300 μm, 400 μm, 500 μm, 700 μm or 1,000 μm was formed thereon.

That is, 100 parts of $TiB_2$ powder having an an average particle size of 0.8 μm, 200 parts of amorphous binder glass based on $SiO_2$-$B_2O_3$-$Al_2O_3$-PbO, 18 parts of acrylic resin as a vehicle and 55 parts of organic solvent butylcarbitol acetate were kneaded to prepare a resistor powder paste having a sheet resistance of 50 kΩ/□.

Figure 4:
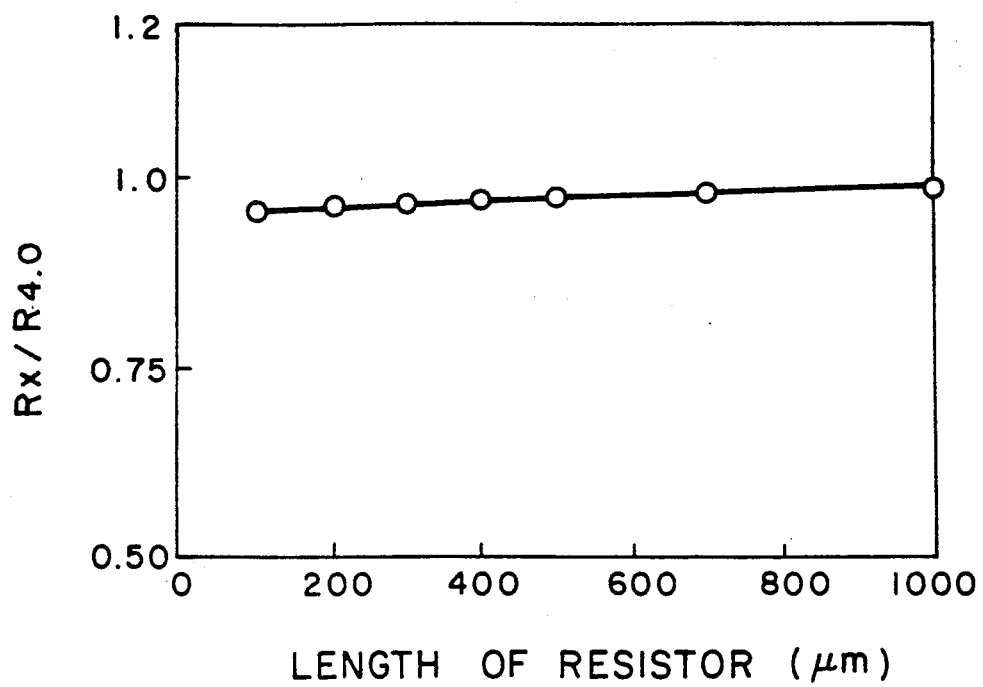
FIG. 4 is a diagram showing a relationship between $R_x/R_{4.0}$ of a resistor according to the present invention (Example 2) and the length of the resistor.

Then, the thus prepared resistor powder paste was applied to the substrate with the foregoing printed copper conductors by screen printing and fired at 120° C. for 10 minutes. Then, a microresistor was formed by photolithography and then the substrate was fired at 900° C. for 10 minutes in a continuous belt-type, tunnel oven. A relationship between the resistance and the length of the thus prepared thick film microresistors is shown in FIG. 4. Even the resistors having a length of less than 500 μm had a stable resistance with a good reproducibility due to the substantial absence of reaction between the crystalline glass and the amorphous glass and thus the absence of the diffusion of glass.

EXAMPLE 3

Figure 5A:
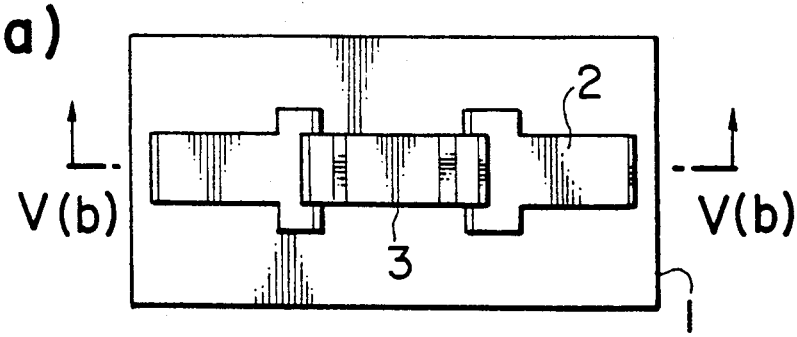
FIG. 5(a) is a plan view of a thick film circuit according to Example 3 and FIG. 5(b) is a vertical cross-sectional view along the line V(b)-V(b) of FIG. 5(a).
Figure 5B:
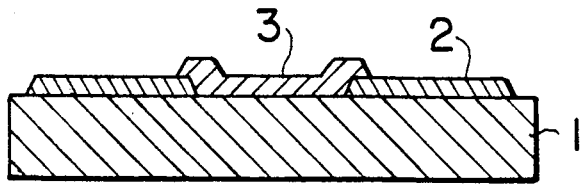

Substrates for hybrid IC having a plan viewed structure of FIG. 5(a) and a vertical cross-sectional structure of FIG. 5(b) were prepared in the same manner as in Example 1, where the width of the terminal parts of the thick film copper conductors 2 was made larger than that of the thick film resistor 3 and the thick film copper conductors 2 were provided in the longitudinal direction of the thick film resistor 3.

100 parts of spherical copper powder having an average particle size of 0.7 μm, 5 parts of binder glass based on $SiO_2$-$B_2O_3$-$Al_2O_3$-PbO, 7 parts of acrylic resin as a vehicle and 22 parts of organic solvent butyl carbitol acetate were kneaded to prepare a copper powder paste.

Then, the thus prepared copper powder paste was applied to the alumina substrate as used in Example 1 by screen printing, dried at 120° C. for 10 minutes and fired at 900° C. for 10 minutes in a continuous belt type, tunnel oven.

Then, two copper conductor electrodes with a line width of 40 μm were formed by photolithography.

Then, a resistor with a constant width of 300 μm and a length of 100 μm, 200 μm, 300 μm, 400 μm, 500 μm, 700 μm or 1,000 μm was formed.

Figure 6:
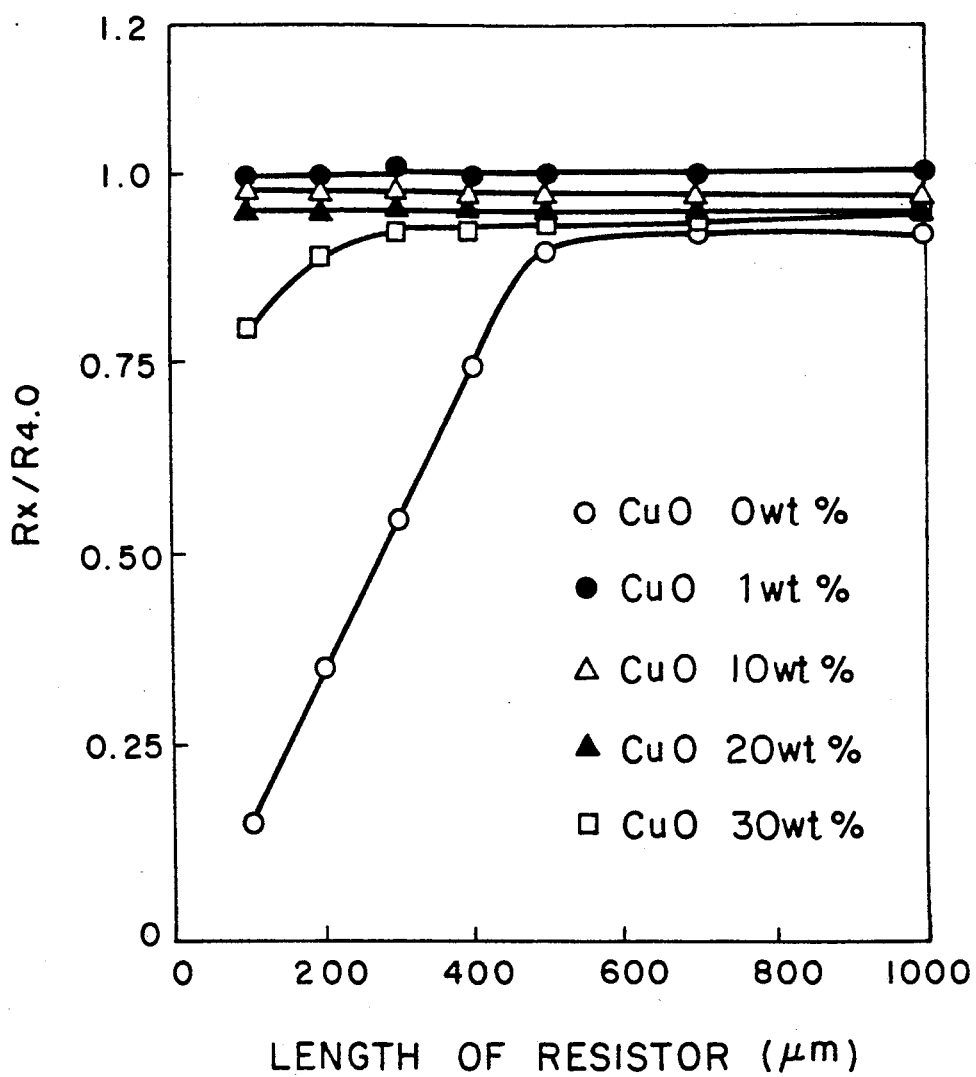
FIG. 6 is a diagram showing a relationship between $R_x/R_{4.0}$ of a resistor according to the present invention (Example 3) and the length of the resistor

That is, 100 parts of $TiB_2$ powder having an average particle size of 0.8 μm, 200 parts of binder glass based on $SiO_2$-$B_2O_2$-$Al_2O_3$-PbO containing 0.1, 10, 20 or 30% or CuO, 18 parts of acrylic resin as a vehicle and 55 parts of organic solvent butylcarbitol acetate were kneaded to prepare a resistor powder paste having a sheet resistance of 50 kΩ/□. The thus prepared resistor powder paste was applied to the substrate with the foregoing printed copper conductors by screen printing and dried at 120° C. for 10 minutes. Then, a microresistor was formed by photolithography. The substrate was fired at 900° C. for 10 minutes in a continuous belt type, tunnel oven. A relationship between the resistance and the length of the thus prepared thick film microresistors is shown in FIG. 6. Owing to use of binder glass containing 1 to 20% of copper oxide, even the resistors having a length of not more than 500 μm preferentially precipitates metallic copper on the copper conductor layer side by virtue of the action of copper conductor layer as a nuclei-forming source when the resistors were fired, and it seems that the metallic copper layer acted as a diffusion-preventing layer to prevent the diffusion of glass. The resistors had a stable resistance with a good reproducibility.

EXAMPLE 4

Substrates for hybrid IC with wiring electrodes having a width of 40 μm and a resistor having a width of 300 μm and a length of 300 μm were prepared in the same manner as in Example 1, 2 or 3, to measure the resistance and the temperature coefficient of resistance. Furthermore, the substrates were subjected to a heat cycle test of −55° C. for 25 minutes −25° C. for 5 minutes −150° C. for 25 minutes. The results are shown in the following Table.

As is apparent from the following Table, the resistors of the present invention had distinguished initial characteristics and reliability.

TABLE 1

| Example No. | Sheet resistance (KI/□) | Temp. coefficient of resistance (ppm/°C.) | Change in resistance after 1,000 repetitions of heat cycle test (%) |
| --- | --- | --- | --- |
| 1 | 49.5 | −98 | 0.10 |
| 2 | 49.3 | −108 | 0.13 |
| 3 | | | |
| Copper oxide (0%) | 25.8 | −40 | 0.15 |
| Copper oxide (1%) | 48.5 | −95 | 0.18 |
| Copper oxide (10%) | 48.6 | −101 | 0.17 |
| Copper oxide (20%) | 48.3 | −105 | 0.03 |
| * Copper oxide (30%) | 30.8 | +508 | 3.8 |

EXAMPLE 5

Figure 7:
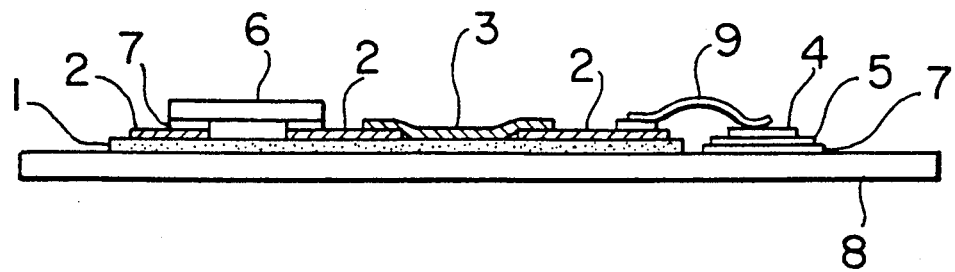
FIG. 7 is a vertical cross-sectional view of a hybrid IC according to Example 5.

FIG. 7 is a vertical cross-sectional view of a hybrid IC with thick film copper conductors 2 and a thick film resistor 2 according to the present invention.

The thick film copper conductors 3 were prepared from a conductor powder paste comprising 100 parts of copper powder and 5 parts of binder glass based on $SiO_2$-$B_2O_3$-$Al_2O_3$-PbO as in Example 1, by application to an alumina substrate 1 and firing and had the same plan viewed structure as in FIG. 2(a). Then, the thick film resistor 3 was formed from a resistor powder paste comprising 100 parts by weight of $TiB_2$ powder and 200 parts of binder glass based on $SiO_2$-$B_2O_3$-$Al_2O_3$-PbO as used in Example 1 by application and firing. A plating was provided on the boundary surfaces between the thick film conductors 2 and the thick film resistor 3. A semiconductor element 4 was bonded to the alumina substrate 1 through a Mo spacer 5 and a solder 7 and electrically connected to the thick film copper conductor 2 as an external lead through a fine wire 9 by bonding. A condenser 6 was also bonded to the thick film copper conductor 2 through the solder 7, and these elements were bonded to a metallic base plate 8. By forming the thick film circuit of the present invention, an ultra-small module with a resistor having a length of 50 μm could be obtained. The entire circuit elements were coated with a silicone rubber, though not shown in FIG. 7.

EXAMPLE 6

Figure 8:
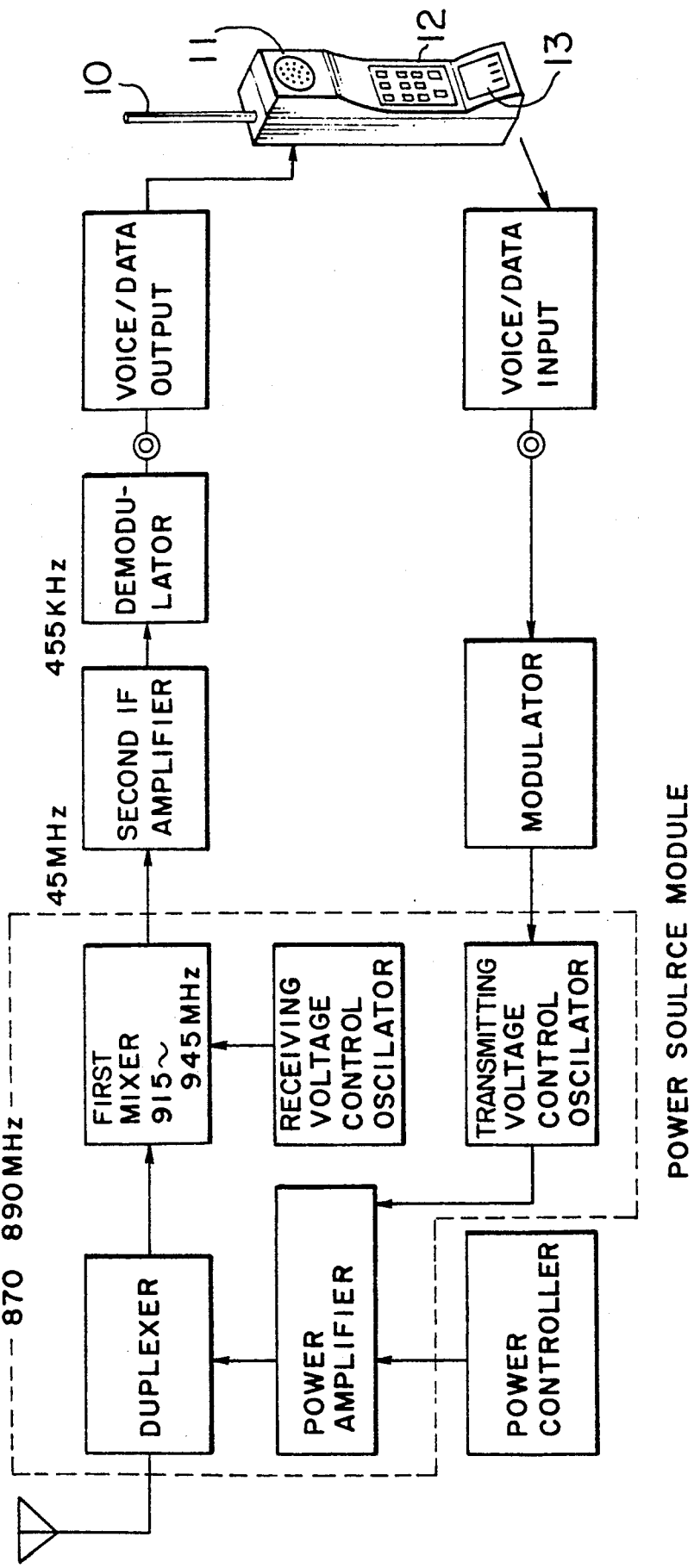
FIG. 8 is a block diagram of a cellular radio communication system according to Example 6 with a perspective view of a transmitter-receiver.
Figure 9:
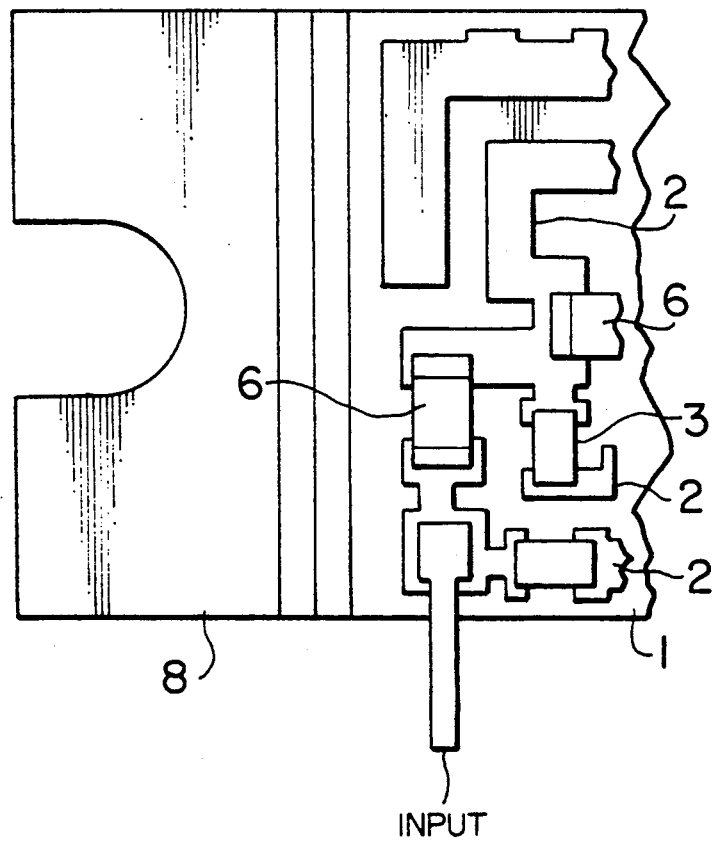
FIG. 9 is a vertical cross-sectional view of one example of the power source module used in the embodiment of FIG. 8.

FIG. 8 is a block diagram of a cellular radio communication system using a power source module for mobile radio communication shown in the plan view of FIG. 9.

The module of FIG. 9 comprises thick film copper conductors 2 and thick film resistors 3 on an alumina substrate 1, and further has such parts as semiconductor elements, quartz oscillators, chip condensers 6, troidal coils, etc. and is provided on a metallic support 8, which is provided a recess for bolt fixing to other members.

In FIG. 8, the area enclosed with the dotted line shows a high frequency area to which the present thick film copper conductors can be effectively applied.

The radio communication transmitter-receiver has an antenna 10, a speaker 11, a dial 12 and a receiver 13. By making the power source module smaller, the cellular radio communication system can be made more compact.

What is claimed is:

1. A resistor-carrying substrate for hybrid IC, which comprises a ceramic base, a thick film resistor containing glass, formed on the ceramic base, a thick film conductor containing glass, formed at the terminals of the thick film resistor, and an electrically conductive means, provided between the conductor and the resistor, for preventing diffusion of the glass of the thick film resistor into the thick film conductor.

2. A resistor-carrying substrate according to claim 1, wherein the glass of the thick film conductor is a lead-aluminum-borosilicate glass.

3. A resistor-carrying substrate according to claim 2, wherein the glass of the thick film resistor is a lead-aluminum-borosilicate glass.

4. A resistor-carrying substrate according to claim 1, wherein the thick film resistor includes an electroconductive intermetallic compound selected from the group consisting of $TiB_2$, $ZrB_2$ and $H_2B_2$.

5. A resistor-carrying substrate according to claim 1, wherein the ceramic base is made of a material selected from the group consisting of alumina, SiC, AlN, $Si_3N_4$ and mullite.

6. A resistor-carrying substrate according to claim 1, wherein the thick film conductor includes copper as an electroconductive material.

7. A hybrid IC, which comprises a ceramic substrate having a semiconductor device mounted thereon, a glass-containing thick film resistor, a glass-containing thick film conductor formed at the terminal of the thick film resistor, both the resistor and conductor being provided on the ceramic substrate, an electrically conductive means, provided between the resistor and the conductor, for preventing diffusion of glass of the thick film resistor into the thick film conductor.

8. A hybrid IC according to claim 7, wherein the ceramic substrate is made from sintered ceramics and is mounted on and joined with a metallic base plate.

9. A power source module for mobile radio communication provided with a hybrid IC according to claim 8.

10. A cellular radio communication system provided with a power source module for mobile radio communication according to claim 9.

11. A resistor-carrying substrate for hybrid IC, which comprises a base, a thick film resistor containing glass, formed on the base, a thick film conductor containing glass, formed at the terminal of the thick film resistor, and a means, provided between the conductor and the resistor, for preventing diffusion of the glass of the thick film resistor into the thick film conductor, the thick film conductor being in a plan-view shape structure wider than the width of the thick film resistor where the thick film conductor is connected to the thick film resistor.

12. A resistor-carrying substrate for hybrid IC, which comprises a base, a thick film resistor containing glass, formed on the base, a thick film conductor containing glass, formed at the terminal of the thick film resistor, and a means, provided between the conductor and the resistor, for preventing diffusion of the glass of the thick film resistor into the thick film conductor, the plan-viewed shape of the thick film conductor being long and narrow and the thick film resistor being perpendicular, in the plan-viewed shape, to the longer side of the conductor.

13. A resistor-carrying substrate for hybrid IC, which comprises a ceramic base; a thick film resistor containing glass, formed on the ceramic base; and a thick film conductor containing glass, formed at the terminals of the thick film resistor; wherein the glass for the conductor is one of a crystalline glass or an amorphous glass, and the glass for the resistor is the other of a crystalline glass or an amorphous glass, so that diffusion of the glass of the conductor and the glass of the resistor respectively into the resistor and into the conductor is prevented.

14. A resistor-carrying substrate for hybrid IC, which comprises a ceramic base, a thick film resistor containing glass, formed on the ceramic base, a thick film conductor containing glass, formed at the terminals of the thick film resistor, and a means, provided between the conductor and the resistor, for preventing diffusion of the glass of the thick film resistor into the thick film conductor, said means for preventing diffusion being a pure metal layer having a higher melting point than the firing temperature of the resistor, provided on the boundary surface between the resistor and the conductor.

15. A resistor-carrying substrate according to claim 14, wherein the means for preventing diffusion of the glass is metallic copper precipitated, on the boundary surface between the resistor and the conductor, from copper oxide of the glass contained in the resistor.

16. A resistor-carrying substrate according to claim 15, wherein the metallic copper is a layer of metallic copper preventing diffusion of glass from the resistor to the conductor.

17. A resistor-carrying substrate according to claim 15, wherein the copper oxide is contained in the glass of the resistor, prior to precipitation of the metallic copper, in an amount of 1% to 20% by weight of the glass.

18. A hybrid IC, which comprises a ceramic substrate having a semiconductor device mounted thereon, a glass-containing thick film resistor, a glass-containing thick film conductor formed at the terminal of the thick film resistor, both the resistor and conductor being provided on the ceramic substrate, a means, provided between the resistor and the conductor, for preventing diffusion of glass of the thick film resistor into the thick film conductor, the entire surfaces of the semiconductor device, the thick film resistor and the thick film conductor being covered with a resin or glass.

\* \* \* \* \*